United States Patent [19]

Wirz et al.

[11] Patent Number: 4,734,183

[45] Date of Patent: Mar. 29, 1988

[54] SPUTTERING CATHODE ON THE MAGNETRON PRINCIPLE

[75] Inventors: Peter Wirz, Waldernbach; Gudrun Przybilla, Alzenau; Karl-Heinz Schuller, Obertshausen; Bernd Cord, Alzenau-Albstadt, all of Fed. Rep. of Germany

[73] Assignee: Leybold-Heraeus GmbH, Cologne, Fed. Rep. of Germany

[21] Appl. No.: 896,939

[22] Filed: Aug. 15, 1986

[30] Foreign Application Priority Data

Jul. 17, 1986 [DE] Fed. Rep. of Germany ....... 3624150

[51] Int. Cl.$^4$ .............................................. C23C 14/34
[52] U.S. Cl. ................................ 204/298; 204/192.12
[58] Field of Search ................. 204/192.2, 192.12, 298

[56] References Cited

U.S. PATENT DOCUMENTS

| 4,401,539 | 8/1983 | Abe et al. ........................ 204/298 X |
| 4,426,264 | 1/1984 | Munz et al. ...................... 204/298 X |
| 4,444,635 | 4/1984 | Kobayashi et al. ............. 204/298 X |
| 4,569,746 | 2/1986 | Hutchinson ......................... 204/298 |
| 4,572,776 | 2/1986 | Aichert et al. ..................... 204/298 |
| 4,595,482 | 6/1986 | Mintz ................................... 204/298 |
| 4,601,806 | 7/1986 | Wirz .................................... 204/298 |
| 4,610,774 | 9/1986 | Sakata et al. ........................ 204/298 |

*Primary Examiner*—John F. Niebling
*Assistant Examiner*—Nam X. Nguyen
*Attorney, Agent, or Firm*—Felfe & Lynch

[57] ABSTRACT

In a sputtering cathode on the magnetron principle with a target consisting of at least one piece and composed of the material to be sputtered, there is disposed in back of the target a magnet system having a plurality of magnet units of alternately different polarity. These form at least two endless magnetic tunnels of arching lines of force situated one within the other. The poles of the magnet units that face away from the target are joined together by a magnet yoke of soft-magnetic material. To solve the problem of being able to deposit coatings of uniform thickness with only one source of power per cathode, provision is made such that the strength of at least one magnetic field forming a magnetic tunnel can be varied relative to the strength of at least one additional magnetic field forming an additional magnetic tunnel.

5 Claims, 6 Drawing Figures

SPUTTERING CATHODE ON THE MAGNETRON PRINCIPLE

BACKGROUND OF THE INVENTION

The invention relates to a sputtering cathode on the magnetron principle, having a target of the material to be sputtered which consists of at least one piece, having a magnet system disposed behind the target with a plurality of magnet units of alternating polarity lying one within the other by which at least two endless magnetic tunnels of arching lines of force are formed which lie one within the other, while the poles of the magnet units facing away from the target are joined together by a magnet yoke of soft-magnetic material.

DE-OS No. 34 42 206 discloses a sputtering cathode of the kind described above, which is intended for the sputtering of targets of ferromagnetic materials. In one of the two embodiments, two endless magnetic tunnels of arcuately curved lines of force are formed, one within the other, by two magnet units lying concentrically one within the other, in conjunction with two concentric air gaps disposed one inside the other. But since in this case the magnetic fields above the two air gaps are magnetically in series, the field strengths of the two tunnels cannot be varied independently of one another. Thus, different sputtering rates develop within the two magnetic tunnels, as well as very different rates of deposition on the substrate confronting the target, so that the thickness of the deposited coating is very irregular.

It is known through DE-OS No. 22 43 708, in the case of bar cathodes, to dispose magnet units one behind the other in the axial direction in order thereby to make the sputtering of the target material uniform. Even in the case of the planar targets therein described it is stated that concentric magnet units lying one within the other and a plurality of magnetic tunnels lying concentrically one within the other can be provided. Here again no provision is made, nor is any possible, for a separate adjustment of each magnetic tunnel to be performed independently of the adjacent tunnel.

Through a sputtering cathode of the kind described above, which is sold by Varian under the name "Con Mag", it is furthermore known to provide a flat circular yoke plate within a flat annular yoke plate with a gap between them, and to associate with each yoke plate two magnet units of opposite polarity, acting independently of one another, while a target having a conical sputtering surface is disposed above the circular magnet system and a planar target plate is disposed above the circular disk-shaped magnet system. No means is provided for varying independently of one another the magnetic field strengths of the two tunnels that are formed. In this sputtering cathode the sputtering effect must be accepted as it is created by the relative position of the magnetic tunnel in relation to the sputtering surfaces.

Now, the distance between the magnet system or systems and the target has a considerable effect on the distribution of the lines of force over the sputtering surface and hence on the so-called "erosion profile", especially when the target consists of a nonferromagnetic material. To compensate the increasing consumption of the target material by the formation of an erosion pit, it is proposed in DE-OS No. 30 47 113 to vary the distance between the magnet system and the back of the target as the consumption of the target material progresses. The magnet system in question, however, consists of only two magnet units which produce a single magnetic tunnel, so that this disclosure, again, contains no suggestion for controlling the coating thickness distribution when two or more magnetic tunnels are used, lying concentrically one within the other.

Furthermore, when a single endless magnetic tunnel is used, the distribution of the thickness of the coating on the substrates depends also to a great extent on the distance between substrate and target. Measurements have shown that, if the distance between the target and the (stationary) substrate is too great, an excessively great coating thickness is to be observed at the center of the substrate, decreasing greatly toward the margins. If the distance between the target and the (stationary) substrate is too small, it can be observed that the coating thickness in the area of the erosion pit is especially great, while it decreases greatly on either side of the erosion pit. As a result, such sputtering cathodes can be used only for coating substrates which have a much smaller diameter than the target.

Varian's "Con Mag" sputtering cathode, described above, springs from the attempt to improve the uniformity of the coating thickness by making not only the magnet systems but also the corresponding target parts completely separate electrically. This, however, requires the use of two current sources per sputtering cathode, and also electrical insulation of the target and cathode parts from one another.

A system of this kind is not suitable for sputtering targets of ferromagnetic materials.

The invention is therefore addressed to the problem of devising a sputtering cathode for both magnetic and nonmagnetic target materials, which will produce coatings of very uniform thickness and yet will be able to operate with only one source of electrical power.

SUMMARY OF THE INVENTION

The solution of the stated problem is accomplished according to the invention, in the sputtering cathode specified above, by making the strength of at least one magnetic field forming a magnetic tunnel variable relative to the strength of at least one additional magnetic field forming an additional magnetic tunnel.

According to the invention, therefore, the different magnet units of the magnet system are electrically separate, while the target or target pieces form electrically a single system for which only a single source of power is required.

By varying the magnetic field strength in the area of the one tunnel relative to the field strength or strengths in the area of the other, adjacent tunnel, an individual adaptation of the specific sputtering output is achieved, i.e., the target material can be sputtered with different intensities in the area of the different magnetic tunnels, so that the sputtering rate can be adapted to the required rate of deposition. Such a sputtering cathode is also adaptable without special difficulty to different distances between target and substrate.

One especially advantageous sputtering cathode is characterized according to the invention by an adjusting means whereby the magnetic flux between the magnet yoke and at least one of the magnet units is variable in relation to the magnetic flux between the magnet yoke and the other magnet units.

Such an adjusting means can, according to the further invention, be formed by making the magnet yoke to consist of an outer piece and an inner piece which are adjustable relative to one another by varying the magnetic transition resistance existing between them.

In the latter case, the outer piece of the yoke consists, for example, of a ring and the inner piece of a circular disk which can plunge more or less deeply into the ring, adjustment being provided by means of a threaded spindle. The overlap between the outer and inner part of the yoke determines the magnetic transition resistance. On the outer piece two endless magnet units are disposed, preferably in fixed relationship to one another, which serve to form a magnetic tunnel over the sputtering surface, while on the inner piece of the yoke there is disposed a magnet unit which interacts magnetically with the inner magnet unit disposed on the outer piece of the yoke, so that a second magnetic tunnel is formed at that location. While the outer magnetic tunnel is substantially unaffected by the fixed arrangement of the magnet units relative to one another, the strength of the magnetic field of the inner magnetic tunnel can be controlled within wide limits by varying the magnetic transition resistance in the area of the yoke, between the two inner magnet units. In this manner it is possible to tune the system as desired, so as to achieve the desired coating thickness distribution.

At the same time it is especially advantageous for at least the distance between at least one of the pieces of the yoke and the target to be variable with the variation of the magnetic transition resistance. In this manner a very precise adjustment of the local sputtering rate on the one hand and of the rate of deposition on the other can be accomplished.

Another alternative embodiment of the invention is characterized in that the magnet yoke has on a portion of its surface a projection on which one of the magnet units is disposed substantially in congruity with the projection, and that on the projection there is disposed a sleeve consisting of soft-magnetic material which is in close contact with the projection and is displaceable thereon, and which is adjustable in the axial direction over the magnet unit such that the dimension "s" of the overlap of sleeve and magnet unit is variable.

In the manner just described, a kind of magnetic "shunt" is formed, which, when there is a great overlap between the sleeve and the magnet unit, gathers to itself a considerable part of the magnetic field and leads it by the shortest path into the yoke plate, so that this part of the magnetic flux is subtracted from the magnetic flux that forms the desired magnetic tunnel over the target.

Additional advantageous developments of the invention will be seen in the rest of the subordinate claims.

BRIEF DESCRIPTION OF THE DRAWING

Embodiments of the invention will now be further explained with the aid of FIGS. 1 to 6.

DETAILED DESCRIPTION OF PREFERRED EMBODIMENT

Figure 1:
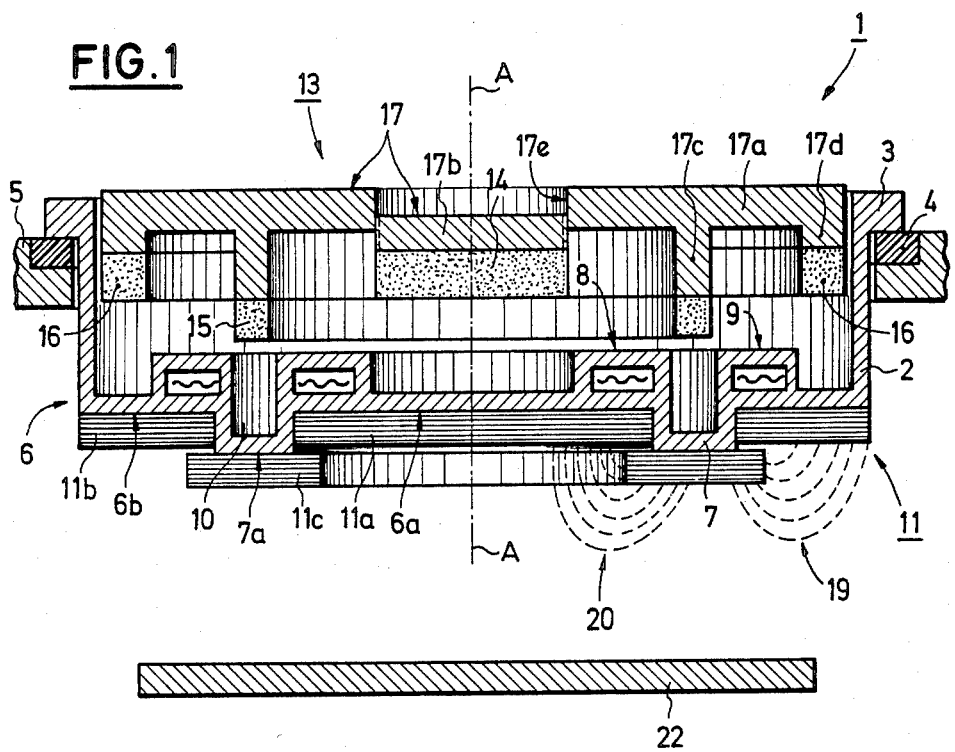
FIG. 1 shows an axial section through a sputtering cathode with a three-piece target of ferromagnetic material, which has two air gaps.

In FIG. 1 there is shown a sputtering cathode 1 which is carried in a pot-like, hollow body 2 which is made of a material of good thermal conductivity (copper) to withstand thermal stress and is inserted into a wall 5 of a vacuum chamber not otherwise shown, on which it is supported by means of a circumferential flange 3 with the interposition of a ring 4 of insulating material.

The pot 2 has a largely planar bottom 6 with a projection 7 extending in the direction of the axis A—A, which itself has a planar annular face 7a. The projection 7 divides the bottom 6 into an inner circular portion 6a and an outer planar annular portion 6b concentric therewith, both lying in a common plane. On the inside of the bottom 6 are two concentric cooling water passages 8 and 9 having a cylindrical gap 10 between them which extends down into the projection 7.

A target 11 is bonded onto the outside of the pot bottom 6 and consists of an inner flat circular piece 11a and of an outer flat annular piece 11b the faces of these pieces being congruent with the corresponding flat circular surface 6a and flat annular surface 6b. On the projection 7 there is disposed an additional flat ring 11c of the target, which projects radially inwardly and outwardly, such that it overlaps the pieces 11a and 11b. The thickness of the target pieces 11a and 11b is less than the height of the projection 7, so that a radial air gap is formed in the direction of the axis A—A between piece 11c and piece 11a on the one hand and between piece 11c and piece 11b on the other, and this gap magnetically divides the target 11 consisting of ferromagnetic material. The air gaps at the same time are narrower than the dark-space interval that establishes itself under the conditions of operation, so that no glow discharge takes place in the air gaps.

In the hollow of the pot 2 there is a magnet system 13 with a plurality of magnet units 14, 15 and 16 which lie one within the other with respect to the axis A—A and all consist of permanent magnetic material and are magnetized in the axial direction. The central magnet unit 14 is in the shape of a compact cylinder. The magnet units 15 and 16 are composed of a plurality of oblong permanent magnets whose faces of equal polarity are situated substantially in a circular plane. We shall here disregard the fact that such an array of permanent magnets actually amounts to a polygon.

The poles of the magnet units 14, 15 and 16 facing away from the target 11 are joined together by a magnet yoke 17 of soft-magnetic material in the manner shown in FIG. 1. The magnet yoke 17 consists also of an outer piece 17a with a flat annular face, and of an inner piece 17 whose face is circular. The outer piece 17a of the yoke has ribs 17c and 17d concentric with the axis A—A, whose ring-like faces confronting the target 11 are the contact surfaces for the magnet units 15 and 16, respectively.

The magnet units are of alternately opposite polarity, and the pole faces confronting the target 11 are a north pole in the case of magnet unit 14, a south pole in magnet unit 15 and a north pole, again, in the magnet unit 16. On account of the air gaps present between the target pieces 11a, 11b and 11c, this results in the formation of two magnetic tunnels 19 and 20 whose lines of force are represented in broken lines in the right half of FIG. 1. Actually, the tunnels 19 and 20 follow the course of the air gaps, i.e., they run all the way around the axis A—A.

Figure 3:
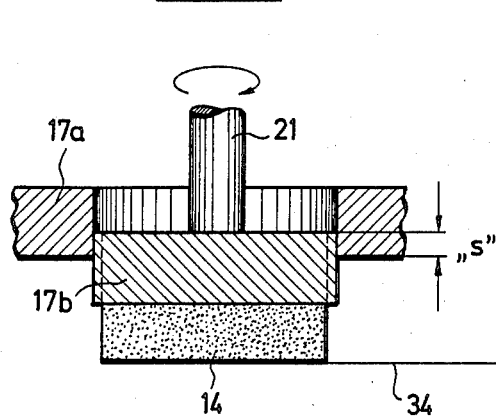
FIGS. 3 and 4 show an adjusting means for the adjustment of the magnetic flux within the magnet yoke according to FIGS. 1 and 2, FIGS. 5 and 6 show an adjusting means with a magnetic shunt as an alternative.
Figure 4:
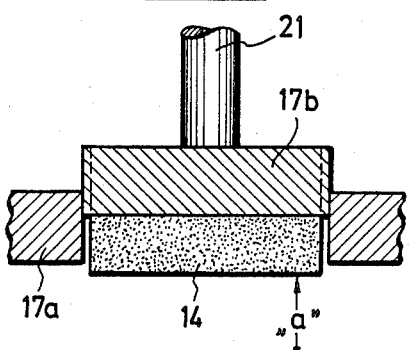

The inner piece 17b of the yoke is adjustable in an opening 17e of the outer piece 17a in a direction perpendicular to the principal plane of the target 11, i.e., in the direction of the axis A—A, so as to vary the amount of overlap "s" (FIG. 3). An adjusting means 21 whereby the inner piece 17 can be rotated serves for the adjustment. Since a screw thread is provided between the two yoke pieces 17a and 17b, turning the adjusting means 21 moves the inner yoke piece 17b into or out of the outer yoke piece 17a. A position of the two pieces of the yoke in relation to one another that is the opposite of that of FIG. 3 is represented in FIG. 4. By the adjusting means 21, the magnetic flux between the magnet yoke 17 and the magnet unit 14 is varied in relation to the magnetic flux between the same magnet yoke 17 and the other magnet units 15 and 16. The magnetic flux between the magnet units 15 and 16 always remains substantially unaffected thereby. As a result, the strength of the magnetic field forming the tunnel is varied relative to the strength of the magnetic field forming the tunnel 19. In this manner the sputtering rates can be varied independently of one another in the area of the magnetic tunnels 19 and 20, so that it is possible to control the local coating thicknesses on the substrate 22 which is situated at a conventional distance from the target and is to be coated with the material of the target 11 (or a reaction product thereof).

Figure 2:
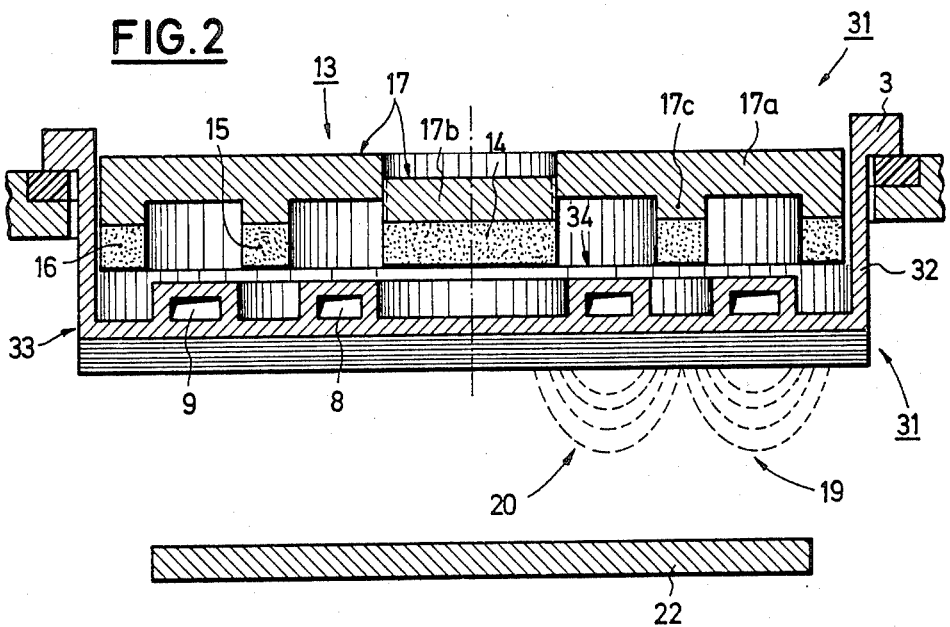
FIG. 2 is an axial section similar to FIG. 1, but with a target of a nonferromagnetic material.

FIG. 2 represents a sputtering cathode 30 whose target 31 is made in one piece and consists of nonmagnetic material. As a result, the pot 32 has a planar bottom face 33 onto which the target 31 is bonded. Since in the case of a target material such as this the formation of air gaps is unnecessary, the face 33 lacks the corresponding projection. The magnet system 13 is of substantially identical construction, only the rib 17c of the outer piece 17a of the yoke is shorter since the pole faces of the magnet units 15 and 16 lie in a common plane 34 in which, with the yoke piece 17b in the position represented, the pole face of the magnet unit 14 also lies. The principle of the adjustment is in this case the same as in FIG. 1, so that the position of the pole face of the magnet unit 14 relative to the plane 34 can also be varied, as is indicated in FIG. 4 by the distance "a". It can therefore be seen that, as the magnetic transition resistance between the pieces 17a and 17b varies, so does the distance of the yoke piece 14 from the target 11. By increasing the distance "a" it is possible, for example, to reduce the field strength of the inner magnetic tunnel 20 in relation to that of the outer magnetic tunnel 19. This advantageously counteracts the concentrating effect of the magnetic lines of force, which occurs due to the fact that, in rotationally symmetrical magnet systems situated one inside the other, the greatest field strength occurs necessarily at the smallest radius. If this effect should remain unaltered, it would result in the effect described above that, in the center of the substrate 22, i.e., in the area of the axis A—A, a much greater coating thickness will occur than, for example, at the margin of the substrate 22 (assuming that the latter is a flat circle and performs no transverse movement with respect to the axis A—A).

Again, in the right half of FIG. 2 the lines of force of two magnetic tunnels 19 and 20 which are produced by the magnet system 13 are indicated in broken lines. The manner in which the relative field strengths of the magnetic fields in question are varied by the movement of piece 17b of the yoke with respect to piece 17a is in principle the same as in the case of the subject matter of FIG. 1.

Figure 5:
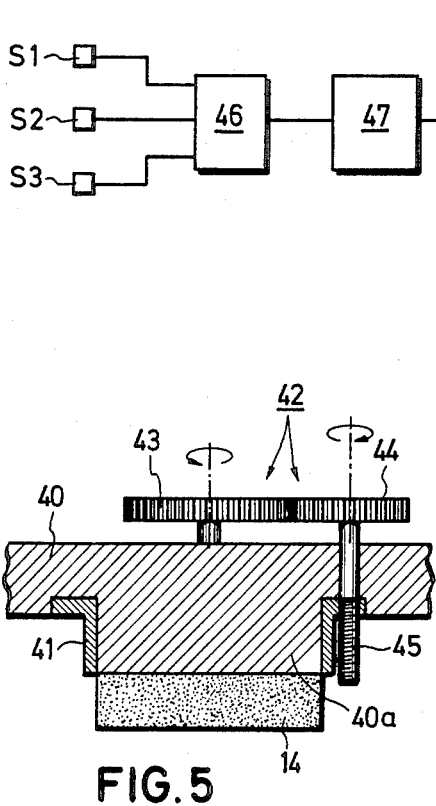
Figure 6:
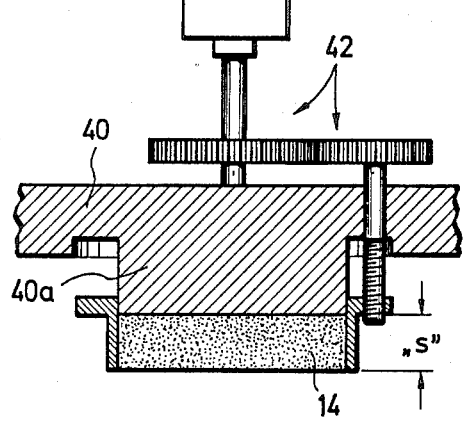

FIGS. 5 and 6 show another possibility for the relative variation of the magnetic field strength of the outer tunnel 19 in relation to the inner tunnel 20 or for varying the magnetic flux between the magnet yoke and the magnet unit 14 on the one hand and the magnetic flux between the magnet yoke 17 and the other magnet units 15 and 16 on the other. In this case, the magnet yoke 40 has on a portion of its surface, namely in the middle, a projection 40a on which the central magnet unit 14 is disposed congruently with the projection 40a. On the projection 40a there is disposed a sleeve 41 consisting of soft-magnetic material closely fitted to the projection and displaceable thereon, which is displaceable in the axial direction over the magnet unit 14 such that the dimension "s" of the overlapping of the sleeve and magnet unit is variable (FIG. 6). The adjusting is performed by an adjusting means 42 which consists of a pair of gears 43 and 44. Gear 44 drives a threaded spindle 45 which engages a flange 41a on the sleeve 41. In this manner the sleeve 41 can be displaced from the upper end position shown in FIG. 4 to a lower end position shown in FIG. 6. The sleeve 41 constitutes a "shunt" which returns a portion of the magnetic flux from the exposed face of the magnet unit 14 along the path of least resistance into the magnet yoke 40 and thereby weakens the field issuing from the pole face of the magnet unit 14. The adjusting systems according to FIGS. 1 to 4 on the one hand and 5 to 6 on the other can replace one another to perform their task.

Whereas in conjunction with FIGS. 1 and 2 rotationally symmetrical sputtering cathodes were discussed, the principle of the arrangement applies also to elongated cathodes, i.e., those which can be thought of as prolonged as desired in a direction perpendicular to the plane of the drawing. Such an elongated cathode can be thought of as being formed by dividing a rotationally symmetrical cathode according to FIGS. 1 and 2 diametrically along the axis A—A and forming a gap between the two halves, and filling this gap with a rectilinear cathode portion whose cross section corresponds precisely to the cross sections shown in FIG. 1 or 2. In sputtering cathodes of this kind, it will be desirable to distribute a plurality of adjusting means along the length so as to be able to guide the inner yoke pieces 17b precisely with respect to the outer yoke pieces 17a. This involves no change in the basic principle of adjustment.

To aid comprehension the magnet systems are represented as lifted slightly upward. In actuality, the magnet units are situated as closely as possible in back of the face plate 6 in that they ar lowered into the indicated cavities.

FIG. 6 also shows the use of the system for the relative adjustment of field strength in conjunction with an automatic control: three sensors S1, S2 and S3 for detecting the coating thickness distribution on the substrate 22 are connected to a differential amplifier 46 whose output is fed to a controller 47. The output of the latter is in turn connected to a power amplifier 48. The output 48a of the power amplifier is connected to a stepping motor 49 for driving the adjusting means 42, so that, by the displacement of the sleeve 41, an optimum coating density distribution can be established. Similar considerations apply to the adjusting means 21 in FIGS. 3 and 4.

We claim:

1. Sputtering cathode comprising a target including at least one piece composed of a material to be sputtered, a magnetic system disposed in back of said target and spread out substantially in one plane said magnetic system comprising at least three permanent magnetic units of alternately different polarity lying one inside the other and self contained to form at least two magnetic tunnels of arcing lines of force which tunnels lie one inside the other and closed on themselves, each of said magnetic units having one pole facing toward and one pole facing away from said target, wherein the poles of the magnetic units facing away from the target are joined together by a magnetic yoke of soft magnetic material which magnetic yoke forms a field of magnetic flux with each of said magnetic units wherein the strength of the magnetic flux between the magnetic yoke and at least one magnetic unit varies relative to the magnetic flux between the magnetic yoke and the rest of the magnet units, wherein a mechanical adjusting means is provided for varying said magnetic flux produced between said magnetic yoke and said at least one magnetic unit and said magnetic flux produced between the magnetic yoke and the rest of the magnetic units.

2. Sputtering cathode according to claim 1, wherein said magnetic yoke comprises one outer piece and one inner piece which are adjustable relative to each other, said adjustability resulting from varying the magnetic resistance between them.

3. Sputtering cathode according to claim 2, wherein the distanace of at least one of the yoke pieces from the target is variable.

4. Sputtering cathode according to claim 3, wherein said inner and outer yoke pieces overlap each other and the inner yoke piece is displaceable in a recess in the outer yoke piece in a direction normal to the principal plane of the target, said displaceability taking place by varying the overlap.

5. Sputtering cathode according to claim 1 wherein the magnetic yoke has on a portion of its surface a projection on which one of the magnetic units is disposed substantially in congruity with the projection, and a sleeve is disposed on the projection which sleeve overlaps said magnetic unit and consists of soft-magnetic material, which sleeve is displaceable in the axial direction over the magnetic unit so as to vary the overlap.

* * * * *

UNITED STATES PATENT AND TRADEMARK OFFICE
CERTIFICATE OF CORRECTION

PATENT NO. : 4,734,183

DATED : March 29, 1988

INVENTOR(S) : Peter Wirz, et al.

It is certified that error appears in the above-identified patent and that said Letters Patent is hereby corrected as shown below:

Column 4, line 55: change "17" to -- 17b --.

Signed and Sealed this

Twenty-ninth Day of November, 1988

Attest:

DONALD J. QUIGG

Attesting Officer

Commissioner of Patents and Trademarks